United States Patent [19]

Suzuki

[11] Patent Number: 4,641,284

[45] Date of Patent: Feb. 3, 1987

[54] SIGNAL TRANSMISSION CIRCUIT FOR A STORAGE DEVICE

[75] Inventor: Yasuo Suzuki, Yokohama, Japan

[73] Assignee: Fujitsu Limited, Kawasaki, Japan

[21] Appl. No.: 696,142

[22] Filed: Jan. 29, 1985

[30] Foreign Application Priority Data

Jan. 31, 1984 [JP] Japan ................................. 59-015590

[51] Int. Cl.$^4$ .............................................. G11C 7/02
[52] U.S. Cl. ..................................... 365/210; 365/230
[58] Field of Search ............... 365/210, 230, 189, 200; 307/530

[56] References Cited

U.S. PATENT DOCUMENTS

4,144,587 3/1979 Miyakawa et al. .............. 365/189 X
4,464,590 8/1984 Rapp ................................. 365/189 X Primary Examiner—Joseph A. Popek
Attorney, Agent, or Firm—Armstrong, Nikaido, Marmelstein & Kubovcik

[57] ABSTRACT

A circuit, having a plurality of input terminals connected to a common output terminal, for transmitting a signal with high fidelity and a small time delay. Each input terminal has a transfer MOS transistor, which isolates it from other terminals in a non-active state, and the input terminal is connected to the common output terminal when an input signal is applied to the input terminal. A buffer circuit, connected between the input terminal and the gate of the MOS transistor, is driven by the input signal and provides a driving signal to the gate electrode of the MOS transistor. The level of the driving signal is sufficiently high to make the MOS transistor conductive so as to transmit the input signal with substantially the same signal profile and an extremely small time lag.

4 Claims, 9 Drawing Figures

SIGNAL TRANSMISSION CIRCUIT FOR A STORAGE DEVICE

BACKGROUND OF THE INVENTION

1. Field of the Invention

The present invention relates to a signal transmission circuit having a plurality of input terminals and a common output terminal for transmitting an input signal pulse without deformation of the inputted signal pulse profile. Particularly, it relates to a simplified signal transmission circuit for a semiconductor storage device for comparing an output of a storage cell with that of a reference cell.

2. Description of the Prior Art

With the rapid development of electronic devices, such as semiconductor storage devices, there is a demand for a signal transmission circuit having plural or multi input terminals and a common output terminal to transmit an input signal without any distortion of the pulse profile and with satisfactory timing. This is particularly important for a multi-state read only memory (ROM), wherein the output voltage of a storage cell is compared with that of associated reference voltages to detect the level of the stored information. A more detailed description of the multi-state ROM is given in the following.

Recently, the demand for a storage device having a high capacity has been increasing. A character generator for KANJI, for example, requires a mask ROM of 1 to 2 M bits capacity. Accordingly, the direction of evolution for a semiconductor storage device has been to increase the number of storage elements per unit area on a semiconductor chip. For this purpose, various technologies for metal-insulator-semiconductor (MIS) devices such as metal-oxide-semiconductor (MOS) devices have been developed to minimize the dimension of the element devices such as MOS field effect transistors (FETs), conducting paths and the like, but there is a technical limitation. In order to overcome the limitation, multi-state storage cells have been used instead of the prior art binary storage cells, because a four state, quaternary, FET ROM, for example, is capable of storing twice as much information per unit area as a conventional binary ROM having the same number of storage devices per unit area on a semiconductor chip. The multi-state storage devices having multi-state FETs have been reported in Electronics, Oct. 9, 1980, page 39 by John G. Posa and Electronics, June 30, 1982, page 81 by J. Robert Lineback.

Figure 1:
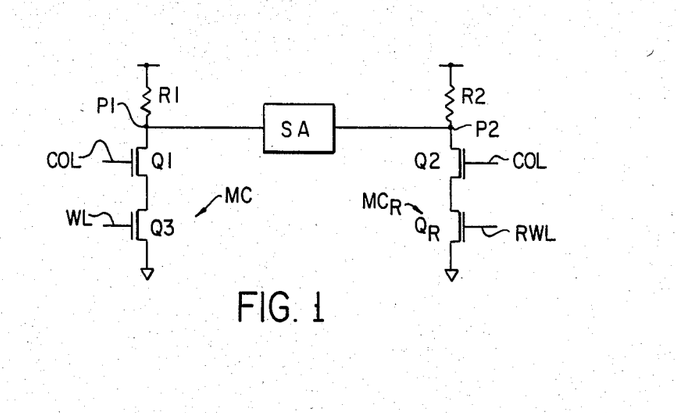
FIG. 1 is a circuit diagram showing schematically a storage cell and a corresponding reference cell to explain how multi-state storage information is detected.

FIG. 1 is a partial circuit diagram showing how the quaternary storage information is detected. The FETs $Q_3$ used for the four state storage cell MC (hereinafter "real cells") has one of four different conductances, $gm_0$ to $gm_3$, storing four different storage states, "0", "1", "2" and "3" respectively. These different gms are provided by varying the resistance of channels of the FETs $Q_3$. There are several techniques for varying the conductance gm of an FET. Throughout this application, the different conductances for an FET are obtained by varying only the channel width W including the channel width W=0. Three reference voltages are created by reference FET $Q_R$. One reference FET $Q_R$ forms one reference cell $MC_R$. The conductances of the reference FETs $Q_{R1}$ to $Q_{R3}$ are respectively $gm_1'$, $gm_2'$ and $gm_3'$, wherein the gms are selected to be $$gm_0 < gm_1' < gm_1 < gm_2' < gm_2 < gm_3' < gm_3$$

The corresponding channel widths $W_0 \ldots$ of the real cell of FETs and $W_1' \ldots$ of the reference of FETs satisfy the relation given by $$W_0 < W_1' < W_1 < W_2' < W_2 < W_3' < W_3$$

Figure 2:
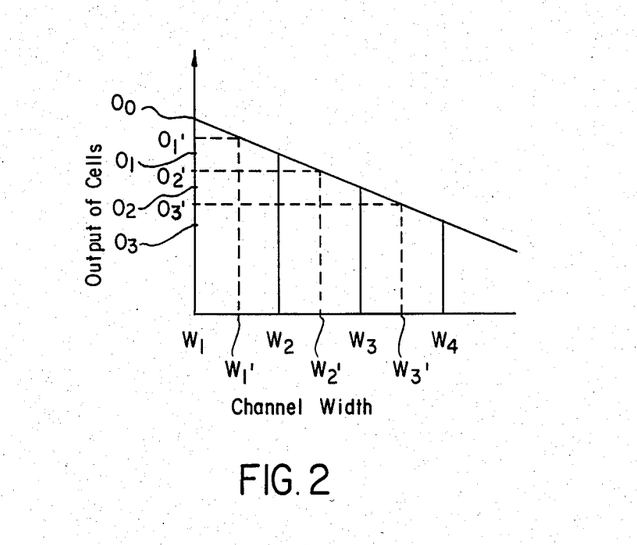
FIG. 2 is a diagram illustrating the relation between the channel width and the output of a field effect transistor.

FIG. 2 illustrates the relation between outputs 0 and channel widths W. Thus, the three outputs $O_1'$ to $O_3'$ of the reference cells $Q_{R1}$ to $Q_{R3}$ divide the output range from $O_0$ to $O_3$ into four portions.

When reading out the storage information, the real cell and the corresponding reference cells are selected by applying column selection signal $V_{COL}$ to the gate of the transfer FETs $Q_1$ and $Q_2$ to make the FETs conductive, and the $Q_3$ and $Q_R$ are connected to the corresponding load resistors $R_1$ and $R_2$ through column lines. Then selection signals $V_{WL}$ and $V_{RWL}$ are applied to the gates of the FETs $Q_3$ and $Q_R$ through the word line WL and the reference word line RWL respectively. Thus, at the nodes $P_1$ and $P_2$, the output O and O' of the cells are outputted. Further, the output of a real cell is compared simultaneously with the outputs from three reference cells $Q_{R1}$ to $Q_{R3}$ by three sense amplifiers $SA_1$ to $SA_3$ respectively (not shown), and a set of the three outputs of the sense amplifiers discriminate the level of the output O of the real cell.

The FETs used for real cells and reference cells have almost the same characteristics except for their conductance, namely, their channel width. As a result, the reference cells serve to provide reference outputs, namely, voltages, as long as the same gate voltage is applied to the gates of FETs for the real cells and reference cells at any instant of time. As stated above, the real cell and the corresponding reference cell are selected by a word line signal rising from the zero level, whereby the word line signal voltage is applied to the gates of the FETs of both cells in exactly the same way: maintaining the same change with time, namely, the same signal shape (a wave profile). Usually, the word lines are formed of poly-crystalline silicon, having a relatively high resistivity. As a result of a distributed parasitic capacitance along the word line, there is a significantly large time delay in the transmitting of signals at each storage cell along the word line. The time delay of the transmitting signal is inevitable. In order to eliminate the gap of the time delay between the respective word line signals at a reference cell and the corresponding real cell, both of which belong to the same column, each row of the reference cells has the same cell numbers and similar word line as those of the corresponding row of real cells. The row of reference cells including its word line is formed as if it is a duplicate of a row of real cells. With this configuration, almost the same time delay occurs at a real cell and the corresponding reference cell both of which are located in the same column. In addition, the profile of the word line signals are not the same, the reason for which will be described below. This is the reason why almost the similar circuit elements, word lines and cell FETs, have been formed in the prior art reference and dummy cell arrays in order to avoid the distortion, decay and time lag of the transmitting word line signals.

The almost double configuration of the prior art circuits occupies a large surface area of the substrate, adversely affecting the high packaging density of the storage device.

Of course, a fixed reference voltage, the power source voltage Vcc, for instance, can be applied to the gate of the FETs of the reference cells to create a fixed reference voltage. In this case, the rising word line signal should be applied to the gates of the FETs of the real cell until the signal reaches its final value, nearly Vcc, utilizing a strobe signal. This requires a relatively long time resulting in a longer access time.

SUMMARY OF THE INVENTION

It is an object of the present invention to provide an input signal transmission circuit having plural input terminals and a common output terminal for transmitting an input signal without any change of signal profile and with practically negligible time delay.

It is another object of the present invention to provide a masked read only memory having multi-state storage cells with a high packing density by reducing the number of the reference cells and the associated word lines.

It is still another object of the present invention to provide a binary level read only memory having reference cells for detecting small output signals of the storage cells wherein the memory has a higher packing density by reducing the number of the reference cells and the associated word lines.

These and other objects, features and advantages of the present invention are accomplished by an improved signal transmitting circuit having multi input terminals and a common output terminal disclosed herein.

In electronic devices, such as an MOS read only memory, there is a demand for a signal transmission circuit having multi input signal terminals and a common output terminal, so that an input signal applied to one of multi input signal terminals can be transmitted to a common output terminal with the least deformation and delay of the signal without any outside interference. A typical example is a quaternary-state MOS ROM, wherein a signal pulse is applied to a gate of an FET of a real memory cell and gates of reference cells and simultaneously the values of the outputs of both cells are compared. These two pulse signals transmitted along word lines, should be completely the same with respect to time and magnitude of the signal, otherwise the reference cell cannot provide a correct reference voltage, as described above.

Therefore, in a prior art four state ROM, for instance, the device has three blocks of reference cells having a completely duplicate construction as that of a real storage block, the three blocks of reference cells occupying a considerably large area on the chip. It is desirable that the number of word lines and the number of rows of reference cells and dummy cells be minimized, by replacing the three blocks of reference cells with a common word line and a common row of reference cells or dummy cells, in order to save the surface area of the substrate of the ROM. Herein, a block of the dummy cells comprising several rows is used for checking the arrival of a transmitted input signal to the end of the row.

A signal transmission circuit, to realize this arrangement, is now discussed. With a prior art transmission circuit comprising multi-input terminals simply connected to a common output terminal, an input signal applied to one of the input terminals will be interfered with by other signals applied to other terminals, and the output signal profile is deformed. With another circuit, wherein multi-input terminals are connected respectively through a diode to a common output terminal, the interference between input signals can be removed, but the output signal profile is distorted by the diode. If each of the multi-input terminals is connected to the common output terminal through each MOS FET instead of a diode, the problem described above can be eliminated, however, additional control signals to each gate of the FETs are necessary, resulting in a more complicated circuit configuration and a cost increase of the device.

The above-mentioned problem can be solved by the signal transmission circuit of the present invention. The circuit of the present invention comprises multi-(plural) input terminals and a common output terminal. Each input terminal is connected to the output terminal through an enhanced p-type MOS FET, which is kept non-conductive when no input signal is applied to the input terminal, namely, the input terminal is isolated from other input and output terminals. When an input signal is applied to one of the input terminals, the MOS FET is made conductive, namely, is opened, by the input signal itself. It should be noted that the FET must be fully opened immediately after the arrival of the input signal. However, if the input signal is directly applied to the gate of the MOS FET, the FET can not be opened immediately, because the enhanced type MOS FET has a threshold voltage and the FET is not conductive until the gate voltage exceeds the threshold voltage. Furthermore, the input signal applied to the gate is not sufficiently high to make the FET fully conductive. In order to provide a sufficiently high input signal with a small time delay to the gate of the FET, to open the FET, a wave-shaping circuit is inserted as a buffer circuit, such as CMOS inverters. With the aid of the inverters, the signal pulse to the gate of the FET is low enough to make the FET substantially conductive. Thus, the signal pulse can be transmitted from the input terminal to the output terminal maintaining almost the same signal profile and having a negligible time delay.

The signal transmission circuit of the present invention is applicable to a binary state storage device wherein output voltages from a real cell are compared with the output signal of reference cells in order to obtain high sensing speed.

As described in the above examples, a transmitting circuit of the present invention makes it possible to transmit a signal applied to the one of the plural input terminals along a common output terminal, without providing or receiving any interference to or from other input terminals, and maintaining the profile of the signal throughout the transmission with practically negligible time delay. Accordingly, the transmission circuit can be applied to electronic devices, particularly to storage devices, resulting in a vast saving of circuits and elementary devices such as word lines and reference storage cells. This leads to a cost reduction and an improvement by obtaining higher packing density of a storage device.

DETAILED DESCRIPTION OF THE PREFERRED EMBODIMENTS

Figure 3:
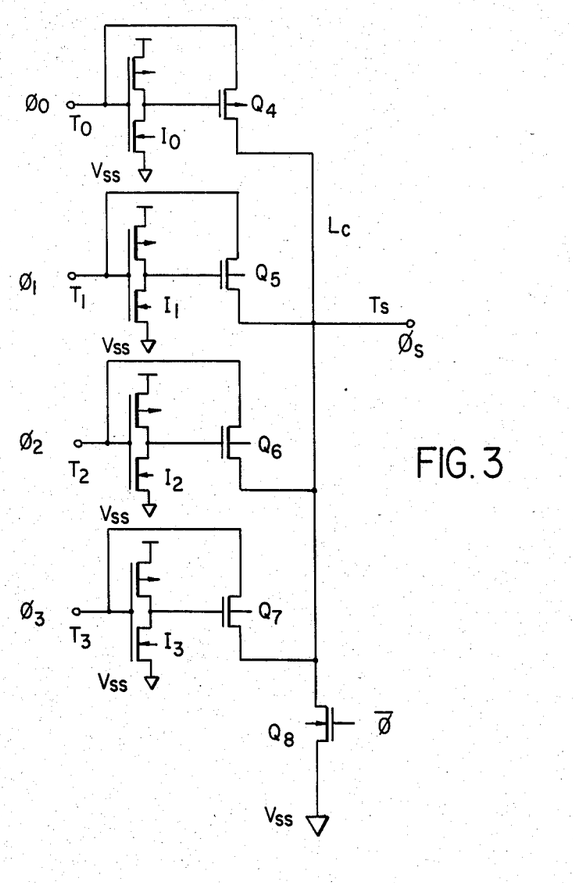
FIG. 3 is a circuit diagram of a signal transmission circuit, namely, an embodiment of the present invention.
Figure 4:
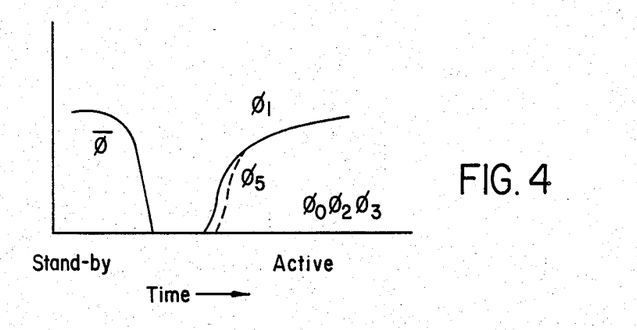
FIG. 4 is a time chart showing the operation of a clock signal and input and output signals of the transmission circuit shown in FIG. 3.

FIG. 3 is a circuit diagram of an embodiment of the present invention. For the simplicity, it is assumed that the embodiment has four CMOS inverters $I_0$ to $I_3$, p-type MOS FETs $Q_4$ to $Q_7$ and an n type MOS FET $Q_8$. The reference letters $\phi_0$ to $\phi_3$ denote input signals applied to input terminals $T_0$ to $T_3$ which correspond to the four word lines of a storage block, which will be described below. The drains of FETs $Q_4$ to $Q_7$ are jointly connected to a common output line Lc, which is connected to a second power source Vss (usually a ground source) through a transistor $Q_8$. When all input signals are at low level, the outputs of the inverters $I_0$ to $I_3$ are high level and transistors $Q_4$ to $Q_7$ are non-conductive. A clock signal $\bar{\phi}$ of a reset circuit is at a high level, as shown in the time chart of FIG. 4, making the transistor $Q_8$ conductive to discharge the residual charge on the output terminal Ts to the ground. As a result, the output terminal Ts is at low level. When the reset signal $\bar{\phi}$ is turned to an active state (low level) and the transistor $Q_8$ becomes non-conductive, the circuit is ready for transmitting signals.

When the input terminal $T_1$, for instance, is selected and other terminals are left non-selected, the gate voltage of the inverter $I_1$ and the source voltage of the transistor $Q_5$ start to rise. The output of the inverter $I_1$ only decreases to a low level and the outputs of other inverters remain at high level. This causes the transistor $Q_5$ to become conductive and other transistors $Q_4$, $Q_6$ and $Q_7$ remain non-conductive, resulting in the transmission of the input signal $\phi_1$ from the input terminal $T_1$ to the output terminal $T_s$, producing an output signal $\phi_s$. The output signal $\phi_s$ maintains substantially the same profile as that of the input signal $\phi_1$. This is because the driving action of the inverter $I_1$ is very quick and the output voltage is sufficiently low. There is a slight delay in the output signal $\phi_s$ due to a threshold voltage of the inverter $I_1$ but it is negligibly small as shown in the time chart of FIG. 4. Thus, the input signal $\phi_1$ is transmitted to the output terminal $T_s$ with almost the same signal profile and a negligible time lag. After transmission of the signal, the potential of the terminal $T_1$ becomes low and the output of the inverter $I_1$ returns to a high level. Thus, the transistor $Q_5$ becomes non-conductive again. In the same way, other input signals $\phi_0$, etc., applied to the respective input terminals, can be transmitted individually.

This transmission circuit is applicable to a storage device such as a read only memory having a plurality of rows of reference storage cells and their word lines. By the use of the above-mentioned transmission circuit, a single word line and a single row of reference cells are sufficient to create a reference signal, resulting in a substantial savings of word lines and reference storage cells. The case is the same with a dummy storage block.

Figure 5:
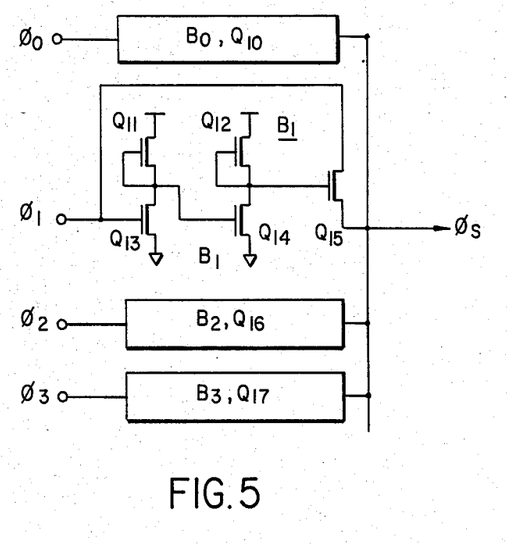
FIG. 5 is a circuit diagram of a signal transmission circuit of the present invention.

The above-mentioned gate transistors $Q_4$, $Q_5$, ... are p-type transistors. When n-type transistors are used instead of the above p-type transistors, the inverters used in the transmission circuit must be doubled in order to provide the gate of the n-type transistor with a positive signal to make it conductive. This circuit configuration is shown in FIG. 5. Transistors $Q_{11}$ and $Q_{12}$ are depletion type FETs with commonly connected gate-source regions, and transistors $Q_{13}$ and $Q_{14}$ are enhanced type FETs. The pairs of two transistors, $Q_{11}$, $Q_{13}$ and $Q_{12}$, $Q_{14}$ form two double inverters. This is regarded as a buffer denoted as $B_1$. The other buffers $B_0$, $B_2$, ... are formed in the same way. $Q_{10}$, $Q_{15}$, $Q_{16}$ and $Q_{17}$ are n-type FETs.

Figure 6:
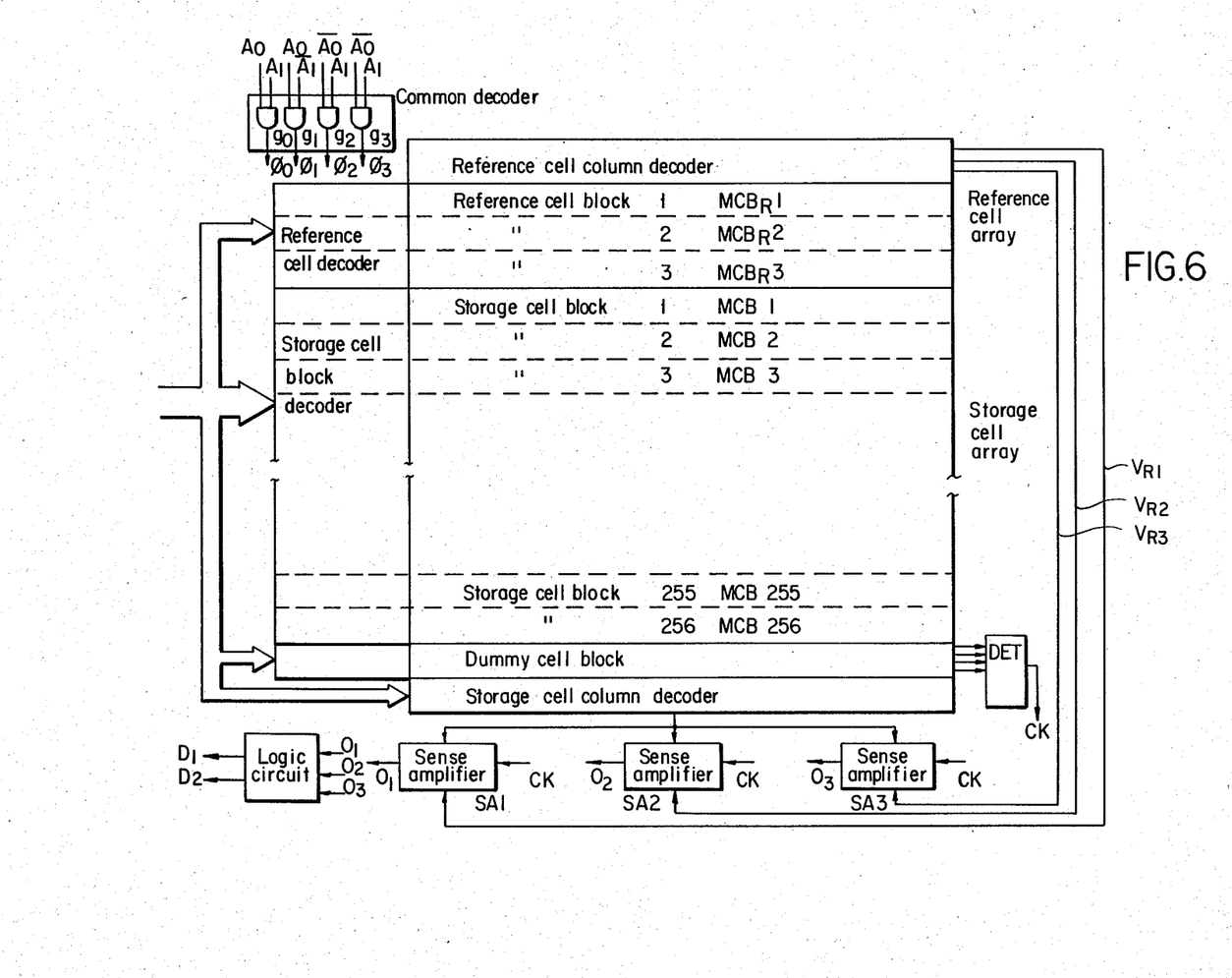
FIG. 6 is a functional block diagram of a four-state MOS read only memory (ROM), having blocked storage cells and reference cells.
Figure 7:
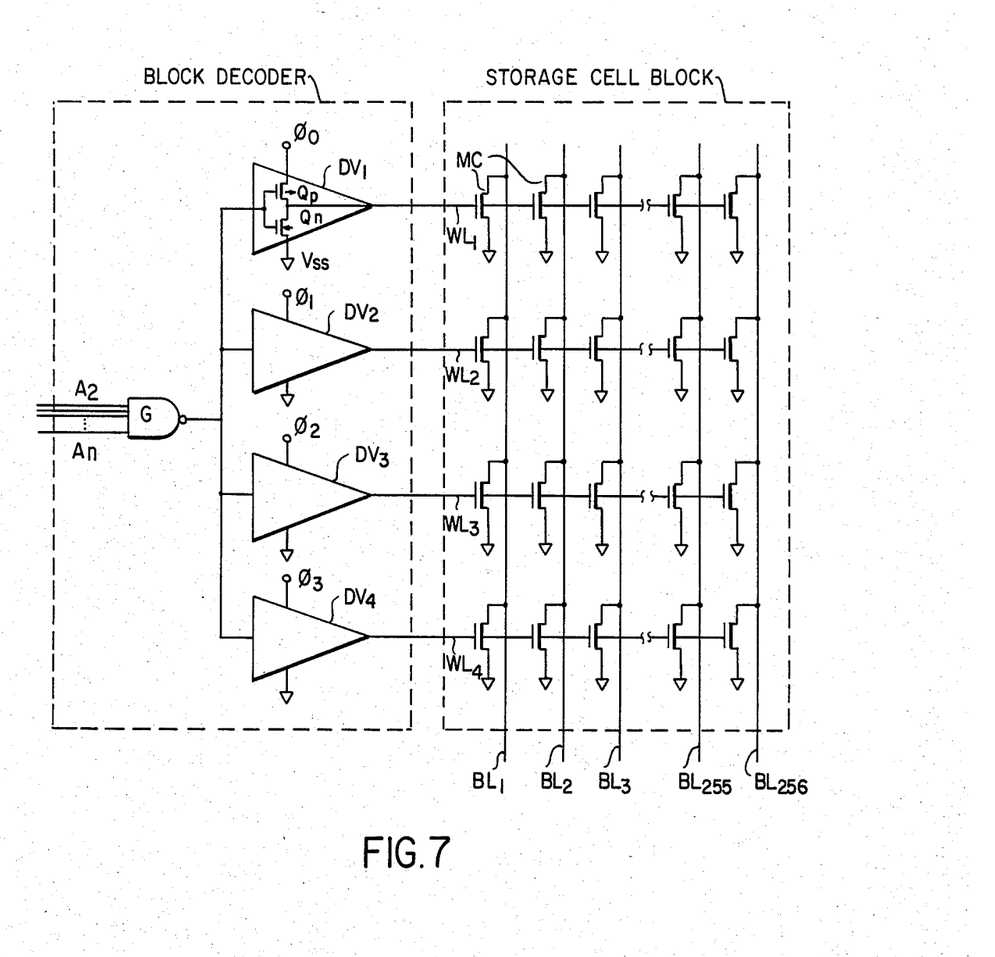
FIG. 7 is a circuit diagram of one of the real storage blocks of the ROM shown in FIG. 6.

FIG. 6 is a functional block diagram of a modern four-state storage device of 2 M bits capacity. The device is one for two bits output. For an eight bit output, four devices of the type shown in FIG. 6 are formed on a substrate. The device comprises a storage cell array divided into 256 blocks MCB 1 to MCB 256, and a reference array of three blocks $MCB_R1$ to $MCB_R3$, for creating three reference voltages. A circuit configuration of the storage cell block and its block decoder is shown in FIG. 7. Each block comprises four rows of storage cells MC, associated four word lines $WL_1$ to $WL_4$ and 256 bit lines $BL_1$ to $BL_{256}$. To one bit line, $256 \times 4$ storage cells MC belonging to one column are connected. Each storage cell block MCB has a block decoder, comprising four drivers $DV_1$ to $DV_4$ and an NAND-gate G. The four drivers $DV_1$ to $DV_4$ are driven by four input signals $\phi_0$ to $\phi_3$ respectively fed from a common decoder (shown in FIG. 6), which commonly drives three reference block decoders, one of the 256 storage cell block decoders and one dummy cell block decoder. The common decoder is formed by four AND-gates $g_0$ to $g_3$. Address signals $A_0$, $\bar{A}_0$, $A_1$ and $\bar{A}_1$ are inputted to each AND gate and depending upon the combination of the four inputted signals, one of output signals $\phi_0$ to $\phi_3$ is outputted. Accordingly, corresponding to the combination of the four address signals $A_0$, $\bar{A}_0$, $A_1$, and $\bar{A}_1$ one of the signals $\phi_0$ to $\phi_3$ is selected to be high level.

The operation of the storage cell block is briefly discussed now with reference to FIG. 6 and FIG. 7. First, a storage cell block is selected by an address signal through a NAND-gate G, putting the output of the gate at a low level. Then by other address signals $A_0$ to $\bar{A}_1$, one of AND-gates $g_0$ to $g_3$ is selected and the output of the selected gate, $\phi_0$ for example, is at high level and the others are all at a low level. The low level output of the NAND-gate G is applied to the gates of p-type FET $Q_p$ and n-type FET $Q_n$ of the real cell block drivers $DV_1$ to $DV_4$, resulting in making the FET $Q_p$ conductive and $Q_n$ non-conductive. In this state the signal $\phi_0$ which is high is transmitted to the word line $WL_1$. Namely, the potential of the word line $WL_1$ rises, and the row is selected. Of course, the other three FETs $Q_p$ are conductive, but the applied signals $\phi_1$ to $\phi_3$ are at a low level, and the word lines $WL_2$ to $WL_4$ remain at a low level, i.e., non-selected. The output of the non-selected NAND-gates of the other storage cell blocks is kept at a high level, and each p-type FET $Q_p$ is non-conductive, isolating associated word line from the other word lines. Each n-type FET $Q_n$ is conductive forcing the associated word line down to ground potential.

Figure 8:
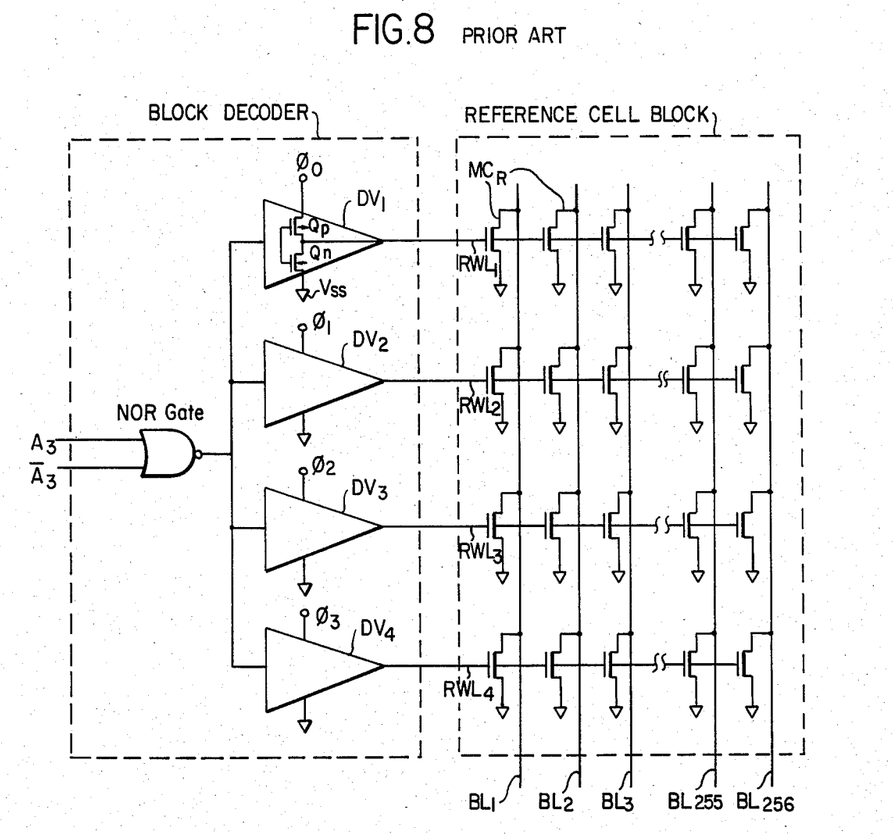
FIG. 8 is a circuit diagram of a prior art reference cell block of the ROM of FIG. 6.

A block diagram of a prior art reference cell block is illustrated in FIG. 8. Each reference cell block has four word lines and rows of reference cells like the real cell block described above. The three reference cell blocks provide three different reference voltages respectively by using four rows of reference FETs. The FETs of each row have their own channel width corresponding to the reference voltage to be created. However, except for the channel width of the reference FETs, all other elements, word lines and reference cells are formed similar to those of the storage cell blocks. This is because the input signals $\phi_0$ to $\phi_3$ are not the same but have some small varieties. The variation is ascribed to the following facts. The word line signals $\phi_0$ to $\phi_3$ are created using a different combination of address signals $A_0$, and so on, as described above. In addition, the AND-gates $g_0$ to $g_3$ are not formed quite the same because of the limitation of space on the substrate. Therefore, selection of a storage cell and three reference cells is performed using the same word line signal. For example, the storage cell block word line $WL_1$ and the reference cell block word line $RW_1$ are selected using the same word line signal $\phi_0$. Thus, for both storage and reference cell blocks, four word lines and four rows of cells are formed in a similar arrangement.

The three reference cell blocks, of course, are selected every time a storage cell block is selected. Therefore, address signals, $A_3$ and $\overline{A}_3$, for example, are always allotted for the reference block.

The dummy cell block has a single word line and a single row of dummy cells, having the same configuration as that of a storage cell block except that all the dummy cells have a widest channel, because the dummy cell block is used for simulating the rising condition of the word line signal voltage at the worst condition for checking the completion of the transmission of the signal along the word line.

The operation of the four-state storage device having reference blocks, is now described with reference to FIG. 6. By a combination of address signals, one of the storage cell blocks MCB 1 to MCB 256 is selected. By raising the level of one of the $\phi_0$ to $\phi_3$ signals, one of the word lines of the selected storage cell block is selected, whereby the outputs of the selected storage cells are outputted to the bit lines $BL_1$ to $BL_{256}$, one of which is selected by a column decoder (shown at the bottom side of FIG. 6) and fed to three sense amplifiers $SA_1$, $SA_2$ and $SA_3$. All of the reference cell blocks are always selected, because the three reference voltages are always necessary. Then the corresponding word lines and bit lines to that of the storage cell block are selected. The outputs of the three selected reference signals $V_{R1}$ to $V_{R3}$ are fed to three sense amplifiers respectively. The two input signals to each of the sense amplifiers are compared to each other and the difference of the two input signals is outputted to discriminate the level of the output of each storage cell.

Similarly, with the dummy cell block, the block itself is always selected and the selection of four word lines is performed in the same way as in the case of reference cell blocks. A detector DET is connected at the end of the dummy word line for sensing the rising of the potential to a predetermined level at the end of the dummy word line. Once sensed by the detector, a clock signal CK is outputted to activate the sense amplifiers $SA_1$ to $SA_3$ and produce the amplifier outputs $O_1$, $O_2$ and $O_3$ respectively. The outputs correspond to the FET of the storage cell selected, denoting the states "0", "1", "2" or "3": "000", "100", "110" or "111". These outputs are processed by a logic circuit to be converted to binary-state signals.

As described in detail, almost a duplicate circuit configuration for the three reference cell blocks and a dummy cell block has been used for a prior art four-state read only device. As a result, a significantly large area is devoted to these circuits.

Figure 9:
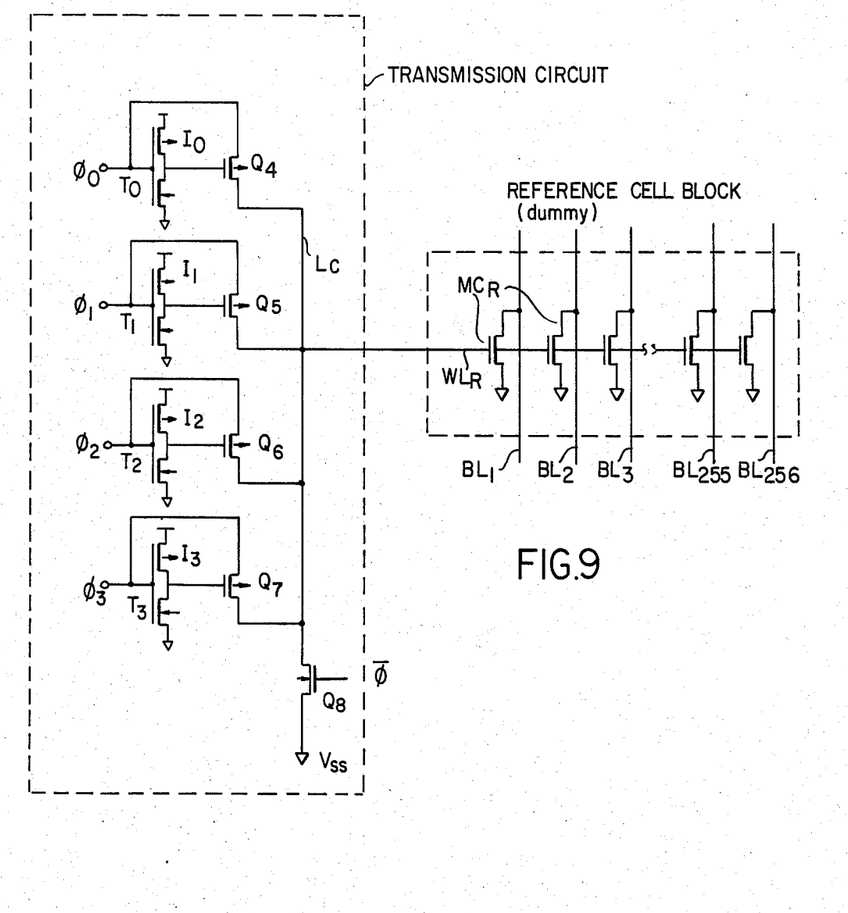
FIG. 9 is a schematic circuit diagram of a reference block of the ROM shown in FIG. 6 having a signal transmission circuit of the present invention.

The transmission circuits according to the present invention are applied to reference storage blocks and dummy blocks of the four-state read only memory to reduce four word lines and rows of cells to a single word line and a single row of cells. FIG. 9 is a schematic wiring diagram of a reference storage block shown in FIG. 8, utilizing a transmission circuit of the present invention shown in FIG. 3, where like reference letters and numerals denote like parts.

The four input terminals shown in FIG. 3 correspond to the four word lines of each of the three reference blocks or one dummy block. As can be clearly seen, a single row of reference storage cells $MC_R$ and a single word line word line $WL_R$ are used instead of the four rows of the cells and the word lines. When any of the input signals $\phi_0$ to $\phi_3$ rises, the same driving signals are applied simultaneously to a selected storage cell and corresponding (at the same column) reference cells $MC_R$ of the three reference blocks. A mutually corresponding storage cell MC and three reference cells $MC_R$ located at the same column, are driven by respective driving signals. It is clear that the driving signals selected have almost no distortion and the signals are transmitted along the word lines for the selected row of storage cells and three rows of reference cells and the row of dummy cells with the same speed and thus, there is no time gap between each signal. By applying the present invention to the prior art read only memory shown in FIG. 6, nine word lines for the reference blocks and three word lines for the dummy blocks can be omitted. In addition, 256×12 storage cells can be saved. These provide the read only memory with a significantly improved high packing density and cost reduction.

So far, the application of the transmission circuit of the present invention is described with regard to storage devices, but the spirit of the present invention is not confined to the devices described above, but applicable to various other apparatus as well.

The many features and advantages of the present invention are apparent from the detailed specification, and thus, it is intended by the appended claims to cover all such features and advantages of a signal transmission circuit which falls within the true spirit and scope of the invention.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims, rather than the foregoing description, and all changes which come within the meaning and range of equivalency of the claims are, therefore, to be embraced therein.

What is claimed is:

1. A signal transmission circuit comprising:
   a common output terminal; and
   a plurality of input circuits connected to said common output terminal, each said input circuit comprising,
   an input terminal;
   a buffer circuit; and
   a metal insulator semiconductor (MIS) transistor, wherein the source-drain regions of said MIS transistor are connected to said input terminal and said output terminal,
   said buffer circuit being connected between said input terminal and the gate electrode of said MIS transistor, wherein said buffer circuit is driven by an input signal selectively applied thereto, wherein said MIS transistor is driven by said buffer circuit to a conductive state whereby said input signal is transmitted from said input terminal to said output terminal.

2. A signal transmission circuit as set forth in claim 1, wherein said MIS transistor is a p-type, channel type transistor and said buffer circuit comprises a CMOS inverter.

3. A signal transmission circuit by claim 1, wherein said MIS transistor is an n-type, channel type transistor and said buffer circuit comprises two CMOS inverters connected in series.

4. A storage device comprising:
   a storage cell array means forming a matrix comprising a plurality of rows of storage cells for storing information;
   a reference storage cell array means comprising a plurality of rows of reference storage cells for providing reference signals, each row of reference storage cells providing one of a predetermined number of reference signals;
   a row of dummy storage cell means for simulating each transmission of a word line signal applied to a row of said storage cells and a row of said reference storage cells, and means for outputting a clock signal in response to said simulated word line signal; and
   a signal transmission circuit for transmitting said word line signal, simultaneously, to a selected row of said storage cells, to all rows of said reference storage cells, and to said row of dummy storage cell means,
   said signal transmission circuit comprising a common output terminal and a plurality of input circuits connected to said common output terminal, each said input circuit comprising an input terminal, a buffer circuit and a metal insulator semi-conductor (MIS) transistor, wherein the source-drain regions of said MIS transistor are connected to said input terminal and said output terminal, and wherein said buffer circuit is inserted between said input terminal and the gate electrode of said MIS transistor, each said buffer circuit being driven by a respective one of a plurality of word line signals applied as an input signal to said input terminal, said MIS transistor being driven into conduction by said buffer circuit receiving an input signal whereby said input signal is selectively transmitted from said input terminal to said output terminal as said word line signal.

* * * * *